United States Patent
Choppalli et al.

(10) Patent No.: US 12,293,994 B2
(45) Date of Patent: May 6, 2025

(54) SEMICONDUCTOR DEVICE INTEGRATION WITH AN AMORPHOUS REGION

(71) Applicant: GlobalFoundries U.S. Inc., Malta, NY (US)

(72) Inventors: Vvss Satyasuresh Choppalli, Bangalore (IN); Anupam Dutta, Bangalore (IN); Rajendran Krishnasamy, Essex Junction, VT (US); Robert Gauthier, Jr., Williston, VT (US); Xiang Xiang Lu, Essex Junction, VT (US); Anindya Nath, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 275 days.

(21) Appl. No.: 17/955,225

(22) Filed: Sep. 28, 2022

(65) Prior Publication Data
US 2024/0105683 A1   Mar. 28, 2024

(51) Int. Cl.
*H01L 25/07* (2006.01)
*H01L 21/77* (2017.01)
(Continued)

(52) U.S. Cl.
CPC ............ *H01L 25/072* (2013.01); *H01L 21/77* (2013.01); *H01L 23/147* (2013.01); *H01L 23/5228* (2013.01)

(58) Field of Classification Search
CPC ....... H01L 25/07–072; H01L 23/60–62; H01L 27/0248–0296; H01L 21/8238–823892; H01L 27/0924
See application file for complete search history.

(56) References Cited

U.S. PATENT DOCUMENTS 4,502,202 A    3/1985   Malhi
4,554,572 A   11/1985   Chatterjee
(Continued)

OTHER PUBLICATIONS

Shengdong Zhang, Ruqi Han, Xinnan Lin, Xusheng Wu and M. Chan, "A stacked CMOS technology on SOI substrate," in IEEE Electron Device Letters, vol. 25, No. 9, pp. 661-663, Sep. 2004, doi: 10.1109/LED.2004.834735.

(Continued)

*Primary Examiner* — Evren Seven
*Assistant Examiner* — Cole Leon Lindsey
(74) *Attorney, Agent, or Firm* — Thompson Hine LLP; Francois Pagette

(57) ABSTRACT

Structures including multiple semiconductor devices and methods of forming same. The structure comprises a first device structure including a first well and a second well in a semiconductor substrate, a second device structure including a doped region in the semiconductor substrate, and a first high-resistivity region in the semiconductor substrate. The first well has a first conductivity type, the second well has a second conductivity type opposite to the first conductivity type, and the first well adjoins the second well to define a p-n junction. The doped region of the second device structure has the first conductivity type or the second conductivity type. The high-resistivity region has a higher electrical resistivity than the semiconductor substrate, and the high-resistivity region is positioned between the first device structure and the second device structure.

20 Claims, 5 Drawing Sheets

(51) Int. Cl.
*H01L 23/14* (2006.01)
*H01L 23/522* (2006.01)

(56) References Cited

U.S. PATENT DOCUMENTS

| | | | |
|---|---|---|---|
| 4,628,589 | A | 12/1986 | Sundaresan |
| 4,654,121 | A | 3/1987 | Miller et al. |
| 2021/0066118 | A1* | 3/2021 | Abou-Khalil ..... H01L 21/26533 |
| 2021/0272812 | A1* | 9/2021 | Adusumilli ............ H01L 29/04 |
| 2021/0280672 | A1* | 9/2021 | Stamper ................ H01L 21/762 |

OTHER PUBLICATIONS

V. W. C. Chan, P. C. H. Chan and M. Chan, "Three dimensional CMOS integrated circuits on large grain polysilicon films," International Electron Devices Meeting 2000. Technical Digest. IEDM (Cat. No. 00CH37138), 2000, pp. 161-164, doi: 10.1109/IEDM.2000.904283.

Y. Uemoto, E. Fujii, A. Nakamura and K. Senda, "A high-performance stacked-CMOS SRAM cell by solid phase growth technique," Digest of Technical Papers. 1990 Symposium on VLSI Technology, 1990, pp. 21-22, doi: 10.1109/VLSIT.1990.110988.

J. Wang et al., "Challenges and Opportunities for Stacked Transistor: DTCO and Device," 2021 Symposium on VLSI Technology, 2021, pp. 1-2.

R. P. Zingg, B. Hofflinger and G. W. Neudeck, "Stacked CMOS inverter with symmetric device performance," International Technical Digest on Electron Devices Meeting, 1989, pp. 909-911, doi: 10.1109/IEDM.1989.74203.

* cited by examiner

SEMICONDUCTOR DEVICE INTEGRATION WITH AN AMORPHOUS REGION

BACKGROUND

The disclosure relates generally to semiconductor devices and integrated circuit fabrication and, more specifically, to structures including multiple semiconductor devices and methods of forming same.

A three-dimensional integrated circuit may be fabricated by stacking wafers or dies and interconnecting the devices on the stacked wafers or dies with vertical interconnections. A three-dimensional integrated circuit enables more functionality within a smaller footprint in comparison with a traditional two-dimensional integrated circuit, but requires additional fabrication operations to bring to fruition.

Improved structures including multiple semiconductor devices and methods of forming same are needed.

SUMMARY

In an embodiment, a structure comprises a first device structure including a first well and a second well in a semiconductor substrate, a second device structure including a doped region in the semiconductor substrate, and a first high-resistivity region in the semiconductor substrate. The first well has a first conductivity type, the second well has a second conductivity type opposite to the first conductivity type, and the first well adjoins the second well to define a p-n junction. The doped region of the second device structure has the first conductivity type or the second conductivity type. The high-resistivity region has a higher electrical resistivity than the semiconductor substrate, and the high-resistivity region is positioned between the first device structure and the second device structure.

In an embodiment, a method comprises forming a first device structure including a first well and a second well in a semiconductor substrate, forming a second device structure including a doped region in the semiconductor substrate, and forming a high-resistivity region in the semiconductor substrate. The first well has a first conductivity type, the second well has a second conductivity type opposite to the first conductivity type, and the first well adjoins the second well to define a p-n junction. The doped region of the second device structure has the first conductivity type or the second conductivity type. The high-resistivity region has a higher electrical resistivity than the semiconductor substrate, and the high-resistivity region is positioned between the first device structure and the second device structure.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
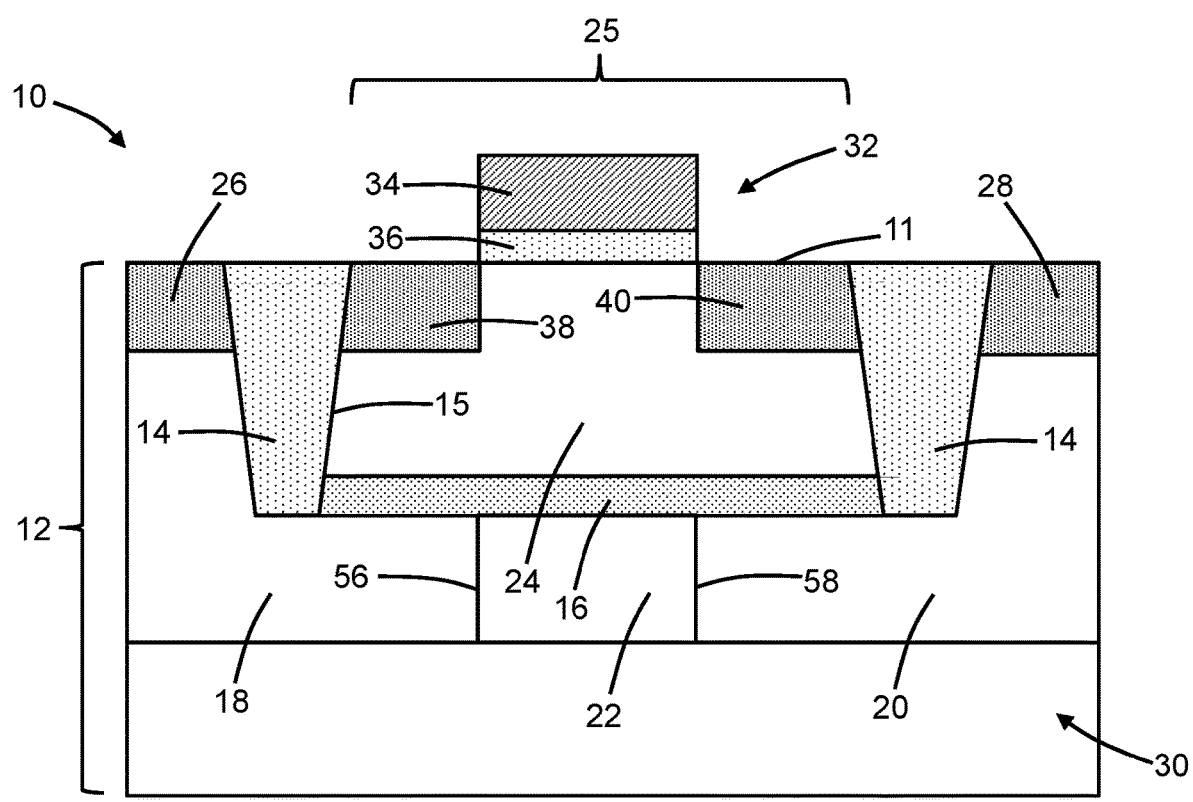
FIG. 1 is a cross-sectional view of a structure in accordance with embodiments of the invention.

With reference to FIG. 1 and in accordance with embodiments of the invention, a semiconductor substrate 12 may be comprised of a semiconductor material, such as a single-crystal semiconductor material. In an embodiment, the semiconductor substrate 12 may be comprised of single-crystal silicon. The semiconductor substrate 12 may be initially doped, before subsequent processing, to have, for example, p-type conductivity. In an embodiment, the semiconductor substrate 12 may be a bulk substrate comprised of a single-crystal semiconductor material.

A shallow trench isolation region 14 may be formed in the semiconductor substrate 12. The shallow trench isolation region 14 may be formed by patterning shallow trenches in the semiconductor substrate 12 with lithography and etching processes, depositing a dielectric material, such as silicon dioxide, in the shallow trenches, and planarizing and/or recessing the deposited dielectric material. The shallow trench isolation region 14 may surround a portion of the semiconductor substrate 12 to define an active device region 25. The active device region 25 has a perimeter 15 that is coextensive with the shallow trench isolation region 14.

A high-resistivity region 16 is positioned in the semiconductor substrate 10. The electrical resistivity of the high-resistivity region 16 may be significantly greater than the electrical resistivity of the semiconductor substrate 10 in the active device region 25 or the portion of the semiconductor substrate 10 that is separated from the active device region 25 by the shallow trench isolation region 14 and the high-resistivity region 16. In an embodiment, the high-resistivity region 16 may be comprised of amorphous semiconductor material, such as amorphous silicon. In an embodiment, the amorphous semiconductor material may be formed in the semiconductor substrate 10 using, for example, an ion implantation process. The high-resistivity region 16 may abut the shallow trench isolation region 14 about an entirety of the perimeter 15 of the active device region 25 such that the active device region 25 is fully isolated from surrounding portions of the semiconductor substrate 10 by the shallow trench isolation region 14 and the high-resistivity region 16. In an embodiment, the high-resistivity region 16 may abut a lowermost portion of the shallow trench isolation region 14 about an entirety of the perimeter 15 of the active device region 25. In an embodiment, the amorphous semiconductor material constituting the high-resistivity region 16 may have an electrical resistivity greater than about 10,000 ohm-cm. In an embodiment, the amorphous semiconductor material constituting the high-resistivity region 16 may have an electrical resistivity greater than about 10,000 ohm-cm and less than the electrical resistivity of an electrical insulator. In an embodiment, the dielectric material constituting the shallow trench isolation region 14 may have a higher electrical resistivity than the amorphous semiconductor material constituting the high-resistivity region 16.

Wells 18, 20 are positioned in the semiconductor substrate 12. The wells 18, 20 extend to a depth that is greater than the depth of the shallow trench isolation region 14. The well 18 may include a portion that extends to a top surface 11 of the semiconductor substrate 12 exterior of the shallow trench isolation region 14 and a portion interior of the shallow trench isolation region 14 that is positioned beneath the active device region 25. Similarly, the well 20 may include a portion that extends to a top surface 11 of the semiconductor substrate 12 exterior of the shallow trench isolation region 14 and a portion interior of the shallow trench isolation region 14 that is positioned beneath the active device region 25.

The wells 18, 20 may be formed by introducing a dopant of a given conductivity type by, for example, ion implantation into the semiconductor substrate 12. A patterned implantation mask may be formed to define selected areas on the top surface 11 of the semiconductor substrate 12 that are exposed for the implantation of ions. The implantation mask may include a layer of an organic photoresist that is applied and patterned to form openings exposing the selected areas on the top surface 11 of the semiconductor substrate 12 and determining, at least in part, the location and horizontal dimensions of the wells 18, 20. The implantation mask has a thickness and stopping power sufficient to block the implantation of ions in masked areas. The implantation conditions (e.g., ion species, dose, kinetic energy) may be selected to tune the electrical and physical characteristics of the wells 18, 20. In an embodiment, the wells 18, 20 may be doped with a concentration of an n-type dopant (e.g., arsenic or phosphorus) to provide n-type conductivity.

Wells 22, 24 are positioned in the semiconductor substrate 12. The well 22 is located in the semiconductor substrate 12 beneath the high-resistivity region 16, and the well 24 is located in the active device region 25 above the high-resistivity region 16. As a result, the high-resistivity region 16 is positioned in a vertical direction between the well 22 and the well 24. The well 22 is positioned in a lateral direction between the well 18 and the well 20. The well 22 adjoins the well 18 along an interface 56 defining a p-n junction, and the well 22 adjoins the well 20 along an interface 58 defining another p-n junction. In an embodiment, the well 24 may be fully separated from the well 22 by the high-resistivity region 16.

The well 22 may be formed by introducing a dopant of a given conductivity type by, for example, ion implantation into the semiconductor substrate 12. A patterned implantation mask may be formed to define a selected area on the top surface 11 of the semiconductor substrate 12 that is exposed for the implantation of ions. The implantation mask may include a layer of an organic photoresist that is applied and patterned to form an opening exposing the selected area on the top surface 11 of the semiconductor substrate 12 and determining, at least in part, the location and horizontal dimensions of the well 22. The implantation mask has a thickness and stopping power sufficient to block the implantation of ions in masked areas. The implantation conditions (e.g., ion species, dose, kinetic energy) may be selected to tune the electrical and physical characteristics of the well 22. The well 22 is doped to have an opposite conductivity type from the wells 18, 20. In an embodiment, the well 22 may be doped with a concentration of a p-type dopant (e.g., boron) to provide p-type conductivity.

The well 24 may be formed by introducing a dopant of a given conductivity type by, for example, ion implantation into the semiconductor substrate 12. A patterned implantation mask may be formed to define a selected area on the top surface 11 of the semiconductor substrate 12 that is exposed for the implantation of ions. The implantation mask may include a layer of an organic photoresist that is applied and patterned to form an opening exposing the selected area on the top surface 11 of the semiconductor substrate 12 and determining, at least in part, the location and horizontal dimensions of the well 24. The implantation mask has a thickness and stopping power sufficient to block the implantation of ions in masked areas. The implantation conditions (e.g., ion species, dose, kinetic energy) may be selected to tune the electrical and physical characteristics of the well 24. The well 24 is doped to have an opposite conductivity type from the wells 18, 20. In an embodiment, the well 24 may be doped with a concentration of a p-type dopant (e.g., boron) to provide p-type conductivity.

A doped region 26 is positioned in the well 18, and a doped region 28 is positioned in the well 20. The doped regions 26, 28 are located in a vertical direction adjacent to the top surface 11 of the semiconductor substrate 12. The doped regions 26, 28 may be doped to have the same conductivity type as the wells 18, 20 but at a higher dopant concentration. In an embodiment, the doped regions 26, 28 may be doped (e.g., heavily doped) with a concentration of an n-type dopant (e.g., arsenic or phosphorus) to provide n-type conductivity. The doped regions 26, 28 may be concurrently formed by selectively implanting ions, such as ions including the n-type dopant, with an implantation mask having openings defining the intended locations for the doped regions 26, 28 in the semiconductor substrate 12.

The portion of the well 18 positioned below the high-resistivity region 16, the portion of the well 20 positioned below the high-resistivity region 16, and the well 22 may define a device structure 30. In the representative embodiment, the device structure 30 is configured as a bipolar junction transistor. The doped regions 26, 28 respectively provide high-conductivity contacts to the wells 18, 20.

A device structure 32 may be fabricated in the active device region 25 of the semiconductor substrate 10. The high-resistivity region 16 acts a separator between the device structure 30 and the device structure 32, and the high-resistivity region 16 cooperates with the shallow trench isolation region 14 to electrically isolate the device structure 32 from the device structure 30. In an embodiment, the device structure 32 may be a field-effect transistor that includes a gate electrode 34, a gate dielectric layer 36, a doped region 38, and a doped region 40. In an embodiment, the doped region 38 may be a source of the field-effect transistor, and the doped region 40 may be a drain of the field-effect transistor. The gate electrode 34 may be comprised of a conductor, such as doped polycrystalline silicon (i.e., doped polysilicon) or a work function metal, and the gate dielectric layer 36 may be comprised of an electrical insulator, such as silicon dioxide or hafnium oxide. The doped regions 38, 40 may be formed by, for example, masked ion implantation into the semiconductor substrate 10 in the active device region 25. In an embodiment, the doped regions 38, 40 may be doped (e.g., heavily doped) with a concentration of a dopant, such as an n-type dopant (e.g., arsenic or phosphorus) that provides n-type conductivity. The well 22 may define a body of the field-effect transistor in which the doped regions 38, 40 are located.

Multiple device structures 30, 32 may be integrated into nominally the same device area in the semiconductor substrate 10. The high-resistivity region 16 provides vertical electrical isolation that enables the integration of the multiple device structures 30, 32 in the same semiconductor substrate 10. The device structure 30 and the device structure 32 may be different device structure types. In the representative embodiment, the device structure 30 is a bipolar junction transistor and the device structure 32 is a field-effect transistor. In alternative embodiments, the device structure 30 may be a different type of junction device structure, such as a silicon-controlled rectifier or a diode. In alternative embodiments, the device structure 32 may be a different device structure type, such as a diode or a bipolar junction transistor. In alternative embodiments, the device structure 30 and/or the device structure 32 may be a diffusion or well resistor. In alternative embodiments, the shallow trench isolation region 14 may be omitted such that the device structures 30, 32 are connected with each other.

Figure 2:
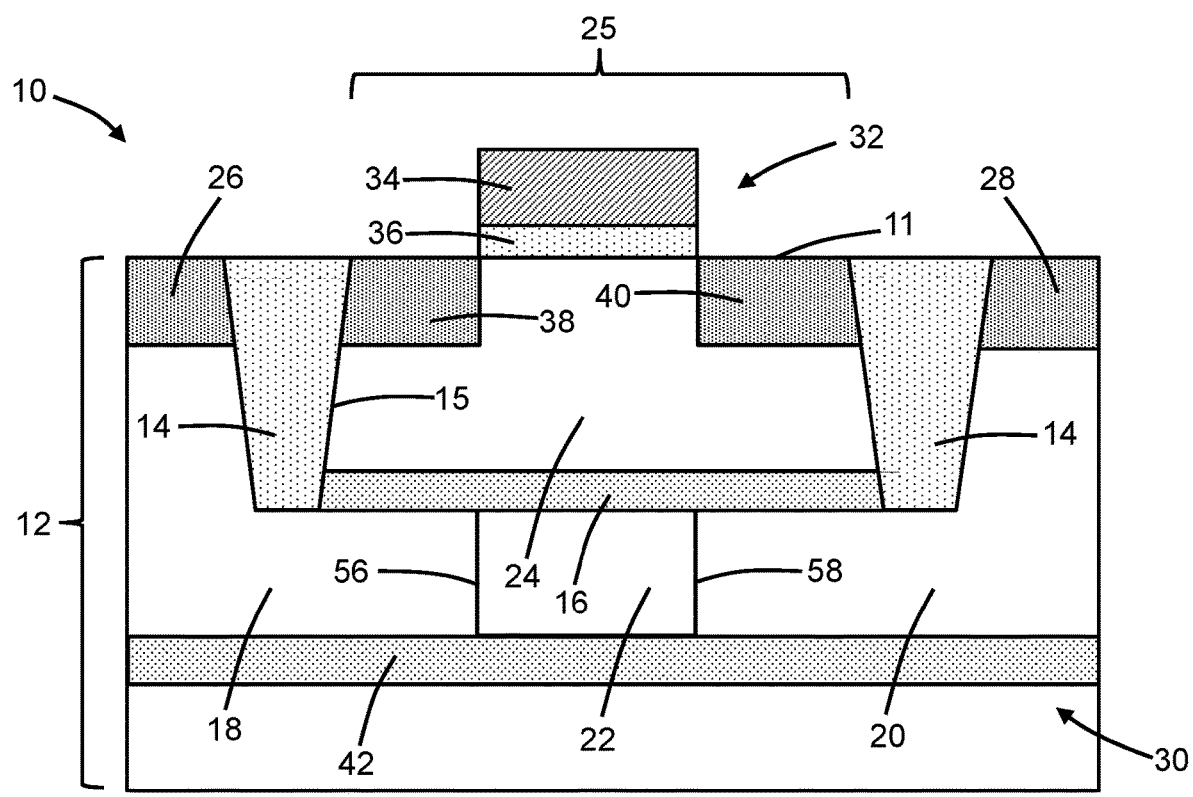
FIG. 2 is a cross-sectional view of a structure in accordance with alternative embodiments of the invention.

With reference to FIG. 2 and in accordance with alternative embodiments of the invention, a high-resistivity region 42 may be formed in the semiconductor substrate 10. The high-resistivity region 42 may extend beneath all of the wells 18, 20, 22 of the device structure 30 such that the high-resistivity region 42 is positioned in a vertical direction between the underlying portion of the semiconductor substrate 12 and the device structure 32. The characteristics of high-resistivity region 42 may be similar or identical to the characteristics of the high-resistivity region 16. The high-resistivity region 16 may be positioned in a vertical direction between the high-resistivity region 42 and the device structure 30. The high-resistivity region 42 may electrically isolate the wells 18, 20, 22 from the semiconductor substrate 10 beneath the wells 18, 20, 22.

Figure 3:
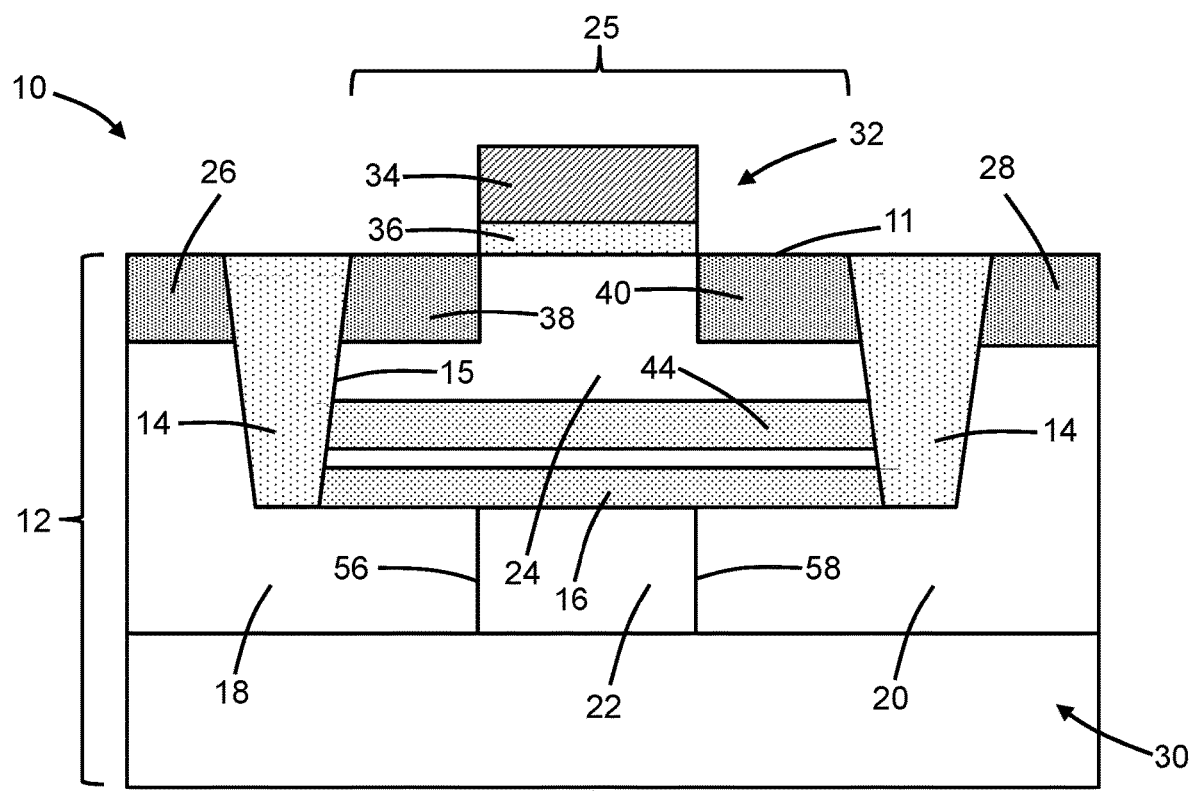
FIG. 3 is a cross-sectional view of a structure in accordance with alternative embodiments of the invention.

With reference to FIG. 3 and in accordance with alternative embodiments of the invention, a high-resistivity region 44 may be formed in the active device region 25 of the semiconductor substrate 10. The characteristics of high-resistivity region 42 may be similar or identical to the characteristics of the high-resistivity region 16. The high-resistivity region 44 may be positioned in a vertical direction between the high-resistivity region 16 and the device structure 30. The high-resistivity region 44 may abut the shallow trench isolation region 14 about an entirety of the perimeter 15 of the active device region 25, and a portion of the well 24 may be positioned in a space between the high-resistivity region 16 and the high-resistivity region 44. The high-resistivity region 44, in combination with the high-resistivity region 16, may increase the vertical electrical isolation.

Figure 4:
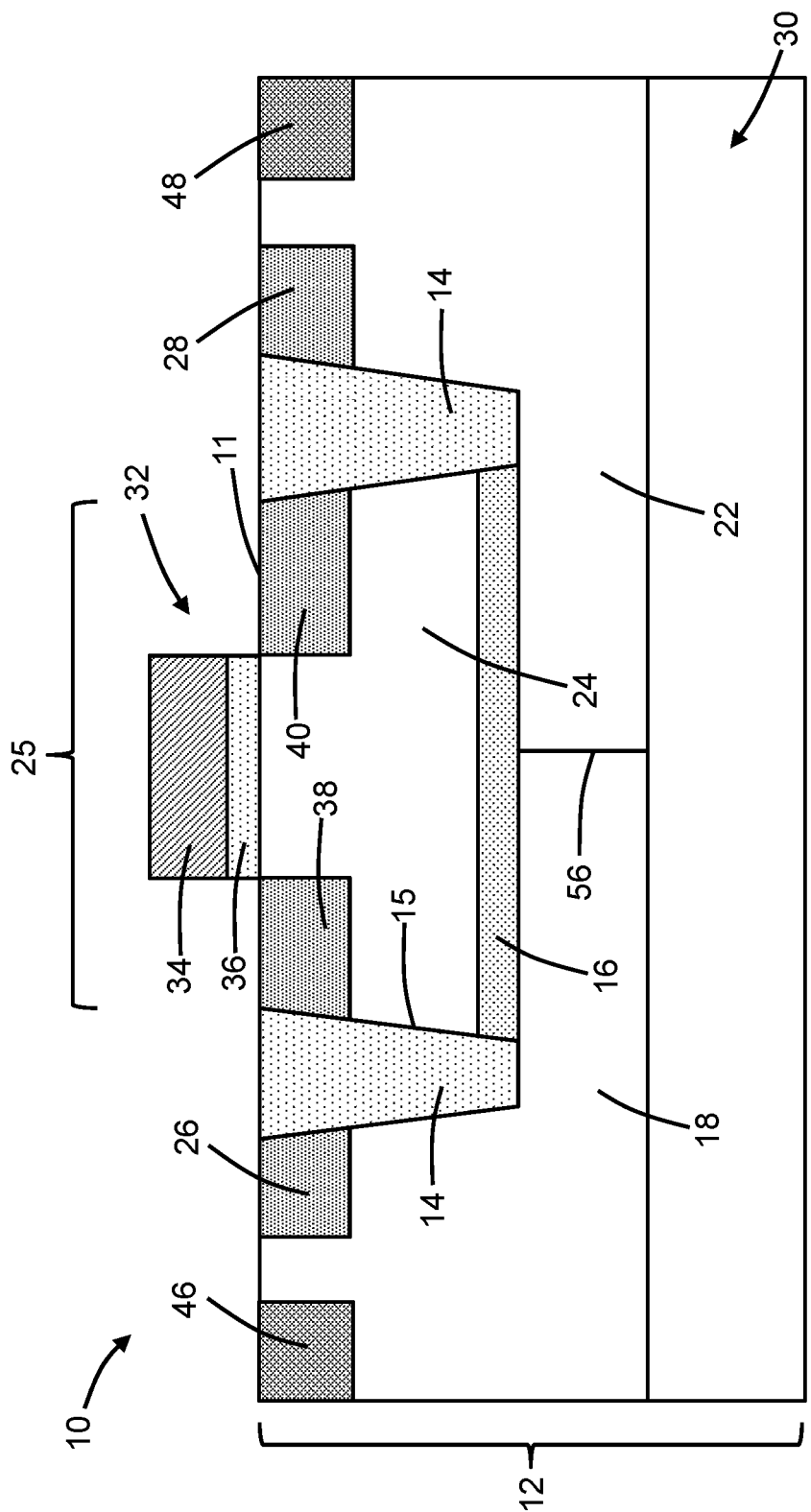
FIG. 4 is a cross-sectional view of a structure in accordance with alternative embodiments of the invention.

With reference to FIG. 4 and in accordance with alternative embodiments of the invention, the device structure 30 may be configured as a silicon-controlled rectifier instead of a bipolar junction transistor. To that end, the well 20 may be eliminated, and the well 22 may be expanded to be accessible at the top surface 11. The doped region 28 may be re-positioned in the semiconductor substrate 12 to be located in the well 22, which has an opposite conductivity type from the doped region 28. The high-resistivity region 16 is positioned in a vertical direction between the device structure 30 and the device structure 32 to contribute to device isolation.

A doped region 46 is positioned in the well 18, and a doped region 48 is positioned in the well 22. The doped regions 46, 48 are located in a vertical direction adjacent to the top surface 11 of the semiconductor substrate 12. The doped region 46 may be doped to have an opposite conductivity type from the well 18, and the doped region 48 may be doped to have the same conductivity type as the well 22 but at a higher dopant concentration. In an embodiment, the doped regions 46, 48 may be doped (e.g., heavily doped) with a concentration of a p-type dopant (e.g., boron) to provide p-type conductivity. The doped regions 46, 48 may be concurrently formed by selectively implanting ions, such as ions including the p-type dopant, with an implantation mask having openings defining the intended locations for the doped regions 46, 48 in the semiconductor substrate 12. The doped region 26 and the doped region 46 may be connected together to define a terminal (e.g., an anode) of the silicon-controlled rectifier, and the doped region 28 and the doped region 48 may be connected together to define another terminal (e.g., a cathode) of the silicon-controlled rectifier.

Figure 5:
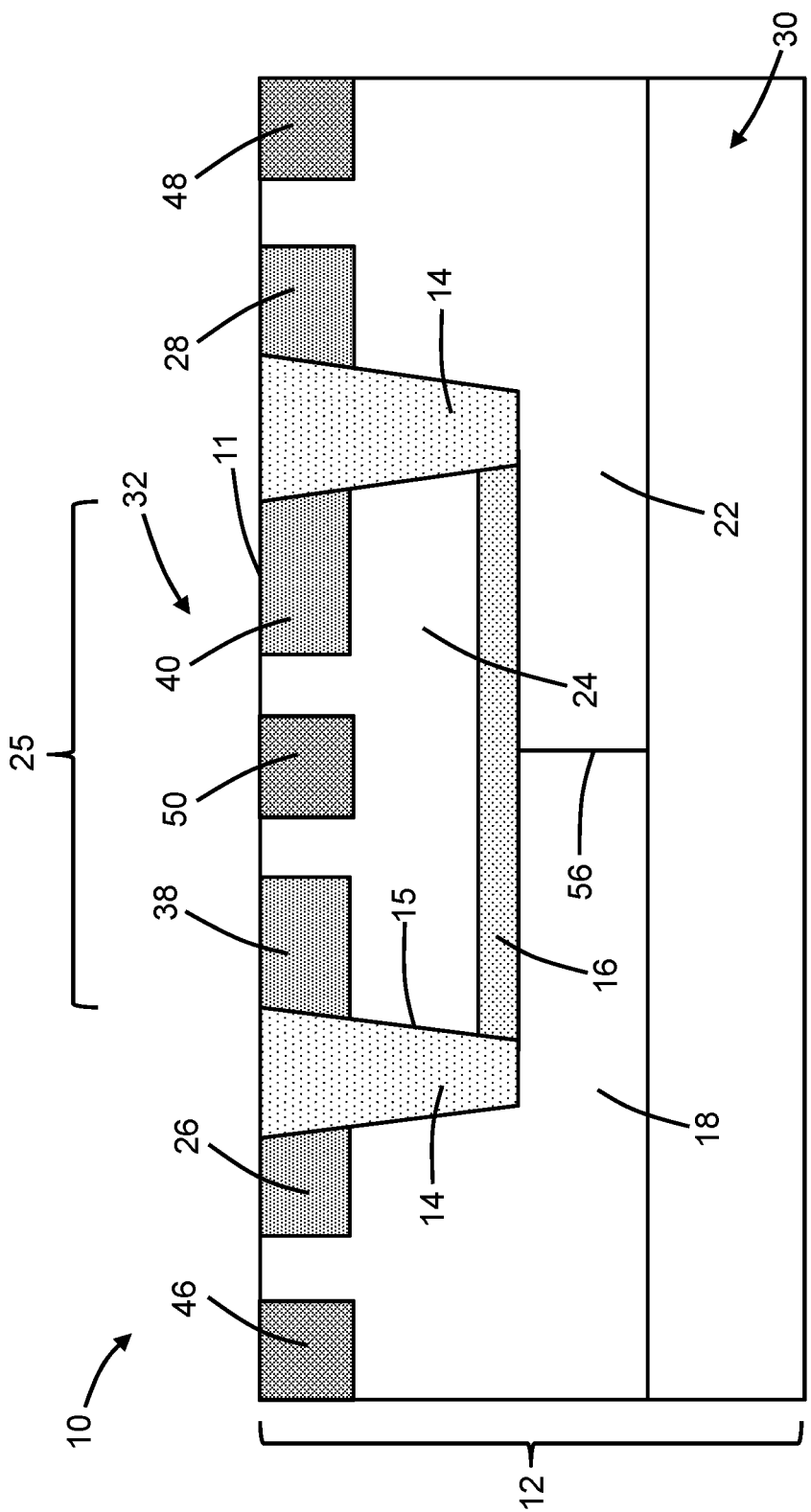
FIG. 5 is a cross-sectional view of a structure in accordance with alternative embodiments of the invention.

With reference to FIG. 5 and in accordance with alternative embodiments of the invention, the device structure 32 may be configured as a bipolar junction transistor instead of a field-effect transistor. In that regard, the doped region 38 may be an emitter of the bipolar junction transistor, and the doped region 40 may be an emitter of the bipolar junction transistor. A doped region 50, which is also positioned in the well 24, may be oppositely doped from the doped regions 38, 40 and may define a base of the bipolar junction transistor. The high-resistivity region 16 is positioned in a vertical direction between the device structure 30 and the device structure 32 to contribute to device isolation.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor substrate;
   a first device structure including a first well and a second well in the semiconductor substrate, the first well having a first conductivity type, the second well having a second conductivity type opposite to the first conductivity type, and the first well adjoining the second well to define a first p-n junction;
   a second device structure including a doped region in the semiconductor substrate, the doped region has the first conductivity type or the second conductivity type; and
   a first high-resistivity region in the semiconductor substrate, the first high-resistivity region having a higher electrical resistivity than the semiconductor substrate, and the first high-resistivity region positioned between the first device structure and the second device structure,
   wherein the first device structure and the second device structure are different device structure types, the first device structure is a bipolar junction transistor, and the second device structure is a field-effect transistor.

2. The structure of claim 1 wherein the first device structure further includes a third well in the semiconductor substrate, the third well has the first conductivity type, the second well is positioned between the first well and the third well, and the third well adjoins the second sell to define a second p-n junction.

3. The structure of claim 1 wherein the doped region of the second device structure is a source or a drain of the field-effect transistor.

4. The structure of claim 1 wherein the first high-resistivity region is positioned in a vertical direction between the first device structure and the second device structure.

5. The structure of claim 4 further comprising:
   a shallow trench isolation region in the semiconductor substrate, the shallow trench isolation region surrounding an active device region,
   wherein the doped region of the second device structure is located in the active device region.

6. The structure of claim 5 wherein the active device region has a perimeter that is coextensive with the shallow trench isolation region, and the first high-resistivity region abuts the shallow trench isolation region about an entirety of the perimeter of the active device region.

7. The structure of claim 6 further comprising:
   a second high-resistivity region in the semiconductor substrate, the second high-resistivity region having a higher electrical resistivity than the semiconductor substrate, and the second high-resistivity region positioned in the active device region between the first high-resistivity region and the doped region of the second device structure.

8. The structure of claim 7 wherein the second high-resistivity region abuts the shallow trench isolation region about the entirety of the perimeter of the active device region.

9. The structure of claim 7 wherein a portion of the semiconductor substrate is positioned between the first high-resistivity region and the second high-resistivity region.

10. The structure of claim 1 further comprising:
    a second high-resistivity region in the semiconductor substrate, the second high-resistivity region having a higher electrical resistivity than the semiconductor substrate, and the first well and the second well positioned in a vertical direction between the first high-resistivity region and the second high-resistivity region.

11. The structure of claim 1 wherein the semiconductor substrate comprises single-crystal silicon, and the first high-resistivity region comprises amorphous silicon.

12. The structure of claim 1 wherein the semiconductor substrate comprises a single-crystal semiconductor material, and the first high-resistivity region comprises an amorphous semiconductor material.

13. The structure of claim 1 wherein the semiconductor substrate is a bulk substrate.

14. The structure of claim 1 wherein the semiconductor substrate comprises a single-crystal semiconductor material, and the first high-resistivity region comprises an amorphous semiconductor material.

15. A structure comprising:
    a semiconductor substrate;
    a first device structure including a first well and a second well in the semiconductor substrate, the first well having a first conductivity type, the second well having a second conductivity type opposite to the first conductivity type, and the first well adjoining the second well to define a first p-n junction;
    a second device structure including a doped region in the semiconductor substrate, the doped region has the first conductivity type or the second conductivity type; and
    a first high-resistivity region in the semiconductor substrate, the first high-resistivity region having a higher electrical resistivity than the semiconductor substrate, and the first high-resistivity region positioned between the first device structure and the second device structure,
    wherein the first device structure and the second device structure are different device structure types, the first device structure is a silicon-controlled rectifier, and the second device structure is a field-effect transistor.

16. The structure of claim 15 wherein the first device structure further includes a first doped region in the first well and a second doped region in the second well, the first doped region has the second conductivity type, and the second doped region has the first conductivity type.

17. The structure of claim 15 further comprising:
    a second high-resistivity region in the semiconductor substrate, the second high-resistivity region having a higher electrical resistivity than the semiconductor substrate, and the first well and the second well positioned in a vertical direction between the first high-resistivity region and the second high-resistivity region.

18. The structure of claim 15 wherein the semiconductor substrate comprises single-crystal silicon, and the first high-resistivity region comprises amorphous silicon.

19. The structure of claim 15 wherein the first high-resistivity region is positioned in a vertical direction between the first device structure and the second device structure.

20. A method comprising:
    forming a first device structure including a first well and a second well in a semiconductor substrate, wherein the first well has a first conductivity type, the second well has a second conductivity type opposite to the first conductivity type, and the first well adjoins the second well to define a first p-n junction;
    forming a second device structure including a doped region in the semiconductor substrate, wherein the doped region has the first conductivity type or the second conductivity type; and forming a high-resistivity region in the semiconductor substrate, wherein the high-resistivity region has a higher electrical resistivity than the semiconductor substrate, and the high-resistivity region is positioned between the first device structure and the second device structure, wherein the first device structure and the second device structure are different device structure types, the first device structure is a bipolar junction transistor or a silicon-controlled rectifier, and the second device structure is a field-effect transistor.

\* \* \* \* \*